United States Patent
Chen et al.

(10) Patent No.: US 7,157,949 B2
(45) Date of Patent: Jan. 2, 2007

(54) DELAY LOCKED LOOP CAPABLE OF PREVENTING FALSE LOCK AND METHOD THEREOF

(75) Inventors: Chien-Ming Chen, Hsin-Chu (TW); Ching-San Wu, Hsin-Chu (TW)

(73) Assignee: Mediatek Incorporation, Hsin-Chu Hsien (TW)

( * ) Notice: Subject to any disclaimer, the term of this patent is extended or adjusted under 35 U.S.C. 154(b) by 5 days.

(21) Appl. No.: 10/907,027

(22) Filed: Mar. 17, 2005

(65) Prior Publication Data
US 2005/0206418 A1    Sep. 22, 2005

(30) Foreign Application Priority Data
Mar. 17, 2004  (TW) .............................. 093107157 A (51) Int. Cl.
*H03L 7/06* (2006.01)

(52) U.S. Cl. ........................ 327/158; 327/149; 327/161

(58) Field of Classification Search ........ 327/148–150, 327/157–159, 161–163
See application file for complete search history.

(56) References Cited

U.S. PATENT DOCUMENTS

| | | | |
|---|---|---|---|
| 5,144,156 A * | 9/1992 | Kawaski .................... | 327/157 |
| 5,940,609 A * | 8/1999 | Harrison ...................... | 713/503 |
| 6,330,296 B1 * | 12/2001 | Atallah et al. .............. | 375/376 |
| 6,452,431 B1 * | 9/2002 | Waldrop ...................... | 327/158 |
| 6,469,550 B1 * | 10/2002 | Kurd ........................... | 327/141 |
| 6,633,190 B1 * | 10/2003 | Alvandpour et al. ......... | 327/291 |
| 6,667,643 B1 * | 12/2003 | Ko .............................. | 327/158 |
| 6,927,635 B1 * | 8/2005 | Miki et al. .................. | 331/1 A |
| 6,954,097 B1 * | 10/2005 | Harrison ...................... | 327/237 |

* cited by examiner

*Primary Examiner*—Timothy P. Callahan
*Assistant Examiner*—Hai L. Nguyen
(74) *Attorney, Agent, or Firm*—Winston Hsu (57) ABSTRACT

A DLL capable of preventing false lock includes a false-lock detector, a delay line coupled for using at least one delay lag of the delay line to delay an incoming clock signal and produce at least one delay clock, and a charge pump coupled to the false-lock detector for adjusting a control voltage according to an upward or downward adjustment signal. The false-lock detector includes a first phase detector coupled to a first clock signal and a second clock signal for comparing phases of the first clock signal and the second clock signal to produce a phase difference signal; an average circuit coupled to the first phase detector for generating an average signal corresponding to an average of the phase difference signal; and a comparator circuit coupled to the average circuit for comparing the average signal with at least one reference signal to produce the upward or downward adjustment signal.

24 Claims, 9 Drawing Sheets

DELAY LOCKED LOOP CAPABLE OF PREVENTING FALSE LOCK AND METHOD THEREOF

BACKGROUND OF INVENTION

The invention relates to delay locked loops (DLLs), and more particularly, to a DLL capable of preventing false lock and a related method of preventing false lock in a DLL.

Figure 1:
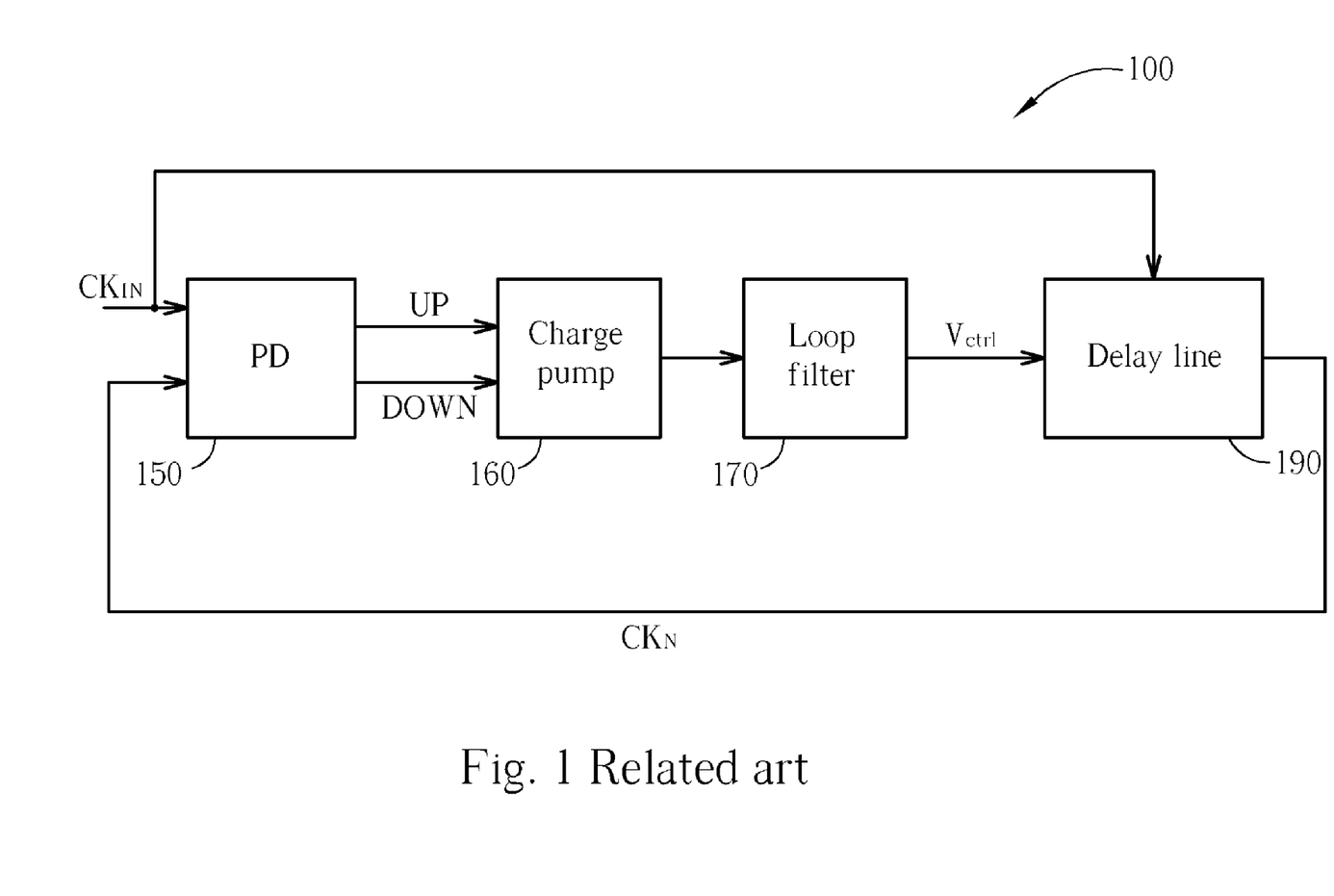
FIG. 1 is a block diagram of a delay locked loop (DLL) according to the related art.

Delay locked loops (DLLs) are a common circuit component used to produce a plurality of delay locked signals having equal frequency but different phase relationships with respect to an incoming clock signal. Please refer to FIG. 1. FIG. 1 shows a block diagram of a DLL 100 according to the related art. As shown in FIG. 1, the DLL 100 includes a phase detector (PD) 150, a charge pump 150, a loop filter 170, and a delay line 190. An incoming clock signal $CK_{IN}$ (having a period of T) is input to the DLL 100, and a voltage control signal $V_{ctrl}$ generated by the DLL 100 is used to control delay stages in the delay line 190. In this example, the delay line 190 has a total of N delay stages connected in series (not shown), the $m^{th}$ delay stage having an output delay clock of $CK_m$ (m being an integer between 1 and N). Wherein, the last delay stage produces a delay clock $CK_N$ lagging the input signal $CK_{IN}$ by a delay lag of Td. The PD 150 receives the incoming clock signal $CK_{IN}$ and delay clock $CK_N$ as inputs and compares their phases to generate an upward adjustment signal UP or a downward adjustment signal DOWN according to the phase difference. By controlling the charge pump 160, the upward adjustment signal UP and the downward adjustment signal DOWN, via the loop filter 170, adjust the value of the control voltage $V_{ctrl}$ to either increase or decrease the delay lag Td between delay clock $CK_N$ and the incoming clock signal $CK_{IN}$.

Theoretically speaking, the operational result of the DLL 100 is that the control voltage $V_{ctrl}$ will be controlled to a value that allows the last delay stage in the delay chain 190 to produce a delay clock $CK_N$ that lags the incoming clock signal by a delay lag Td equal to the value of T. Therefore, if the delay lag Td is not equal to T, the upward adjustment signal UP and the downward adjustment signal DOWN will adjust the value of the control voltage $V_{ctrl}$ to the appropriate value via the loop filter 170.

Figure 2:
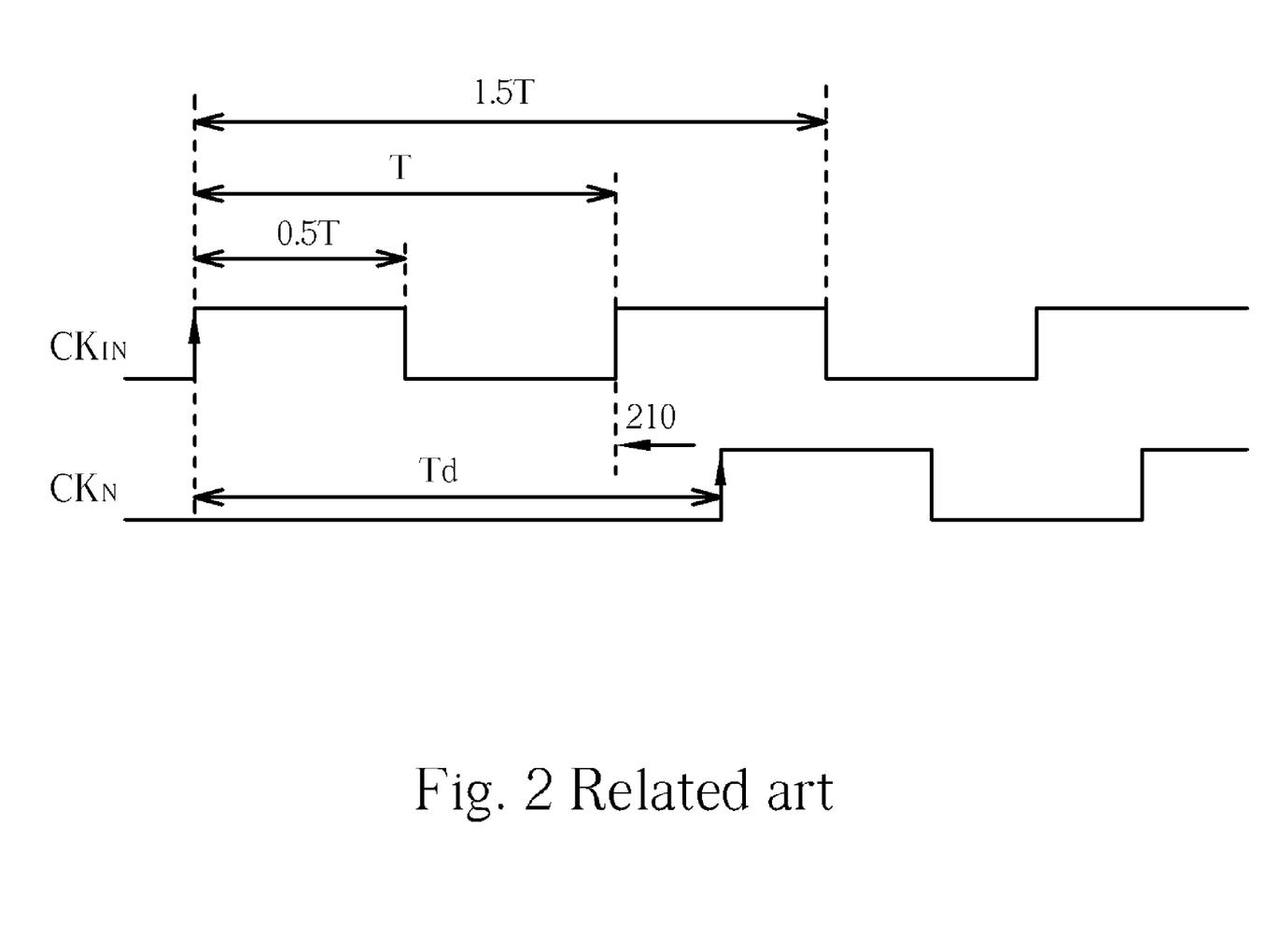
FIG. 2 and FIG. 3 are signal diagrams of the traditional DLL of FIG. 1 during normal operations.
Figure 3:
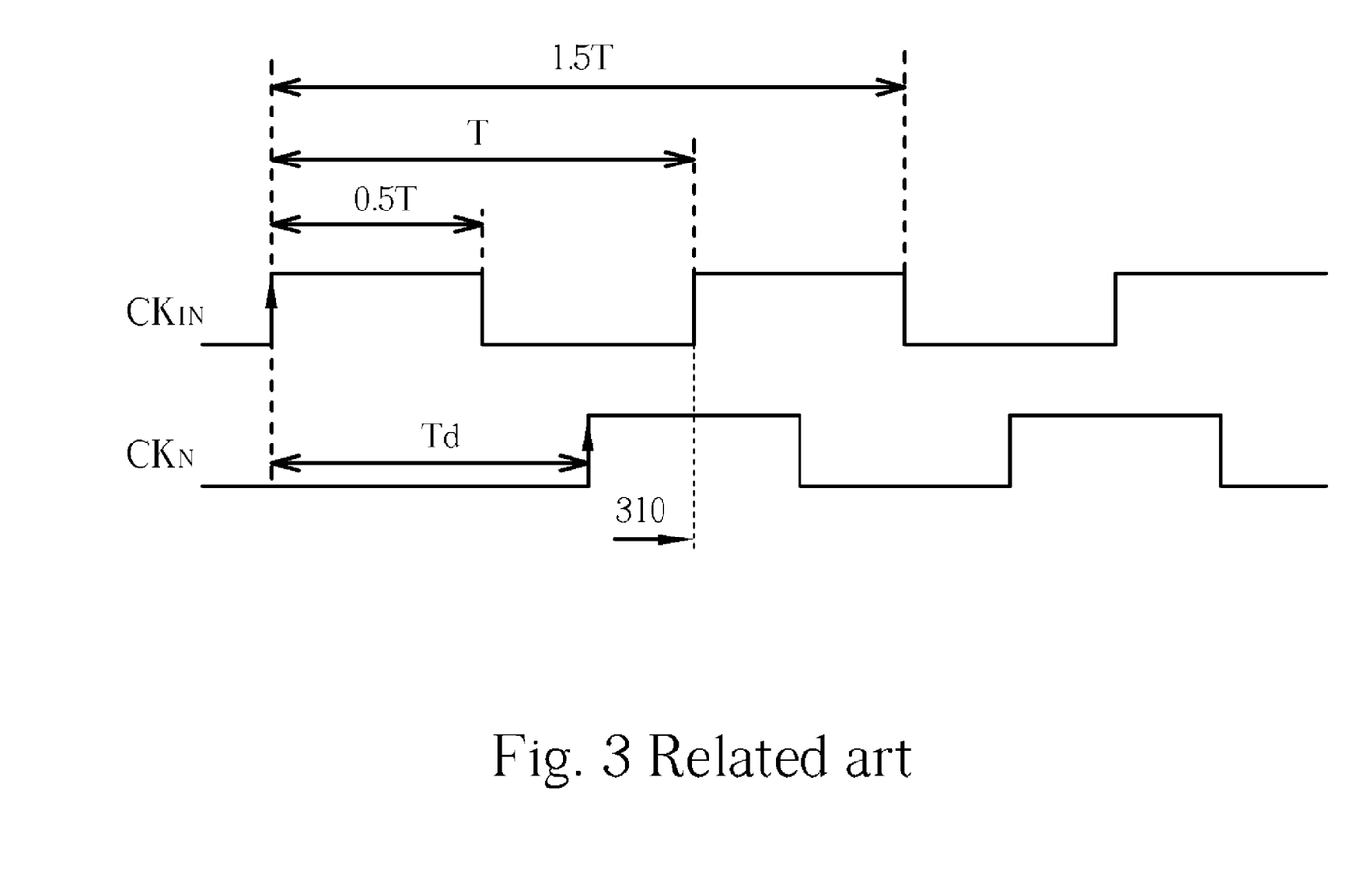

Please refer to FIG. 2 and FIG. 3 showing signal diagrams of a traditional DLL during normal operations. In FIG. 2, delay clock $CK_N$ lags the incoming clock signal $CK_{IN}$ by a delay lag of Td being between 1 T and 1.5 T. During locking operations of the DLL, the rising edge of delay clock $CK_N$ is adjusted toward the nearest rising edge of the incoming clock signal $CK_{IN}$. Because of this, the traditional DLL corrects delay clock $CK_N$ in the direction shown by arrow 210 (thereby decreasing the delay lag Td) until the final result is that delay clock $CK_N$ is locked with a delay lag of Td=1 T. In FIG. 3, delay clock $CK_N$ lags the incoming clock signal $CK_{IN}$ by a delay lag of Td being between 0.5 T and 1 T. During locking operations of the DLL, the rising edge of delay clock $CK_N$ is adjusted toward the nearest rising edge of the incoming clock signal $CK_{IN}$. Because of this, the traditional DLL corrects delay clock $CK_N$ in the direction shown by arrow 310 (thereby increasing the delay lag Td) until the final result is that delay clock $CK_N$ is locked with a delay lag of Td=1 T.

Figure 4:
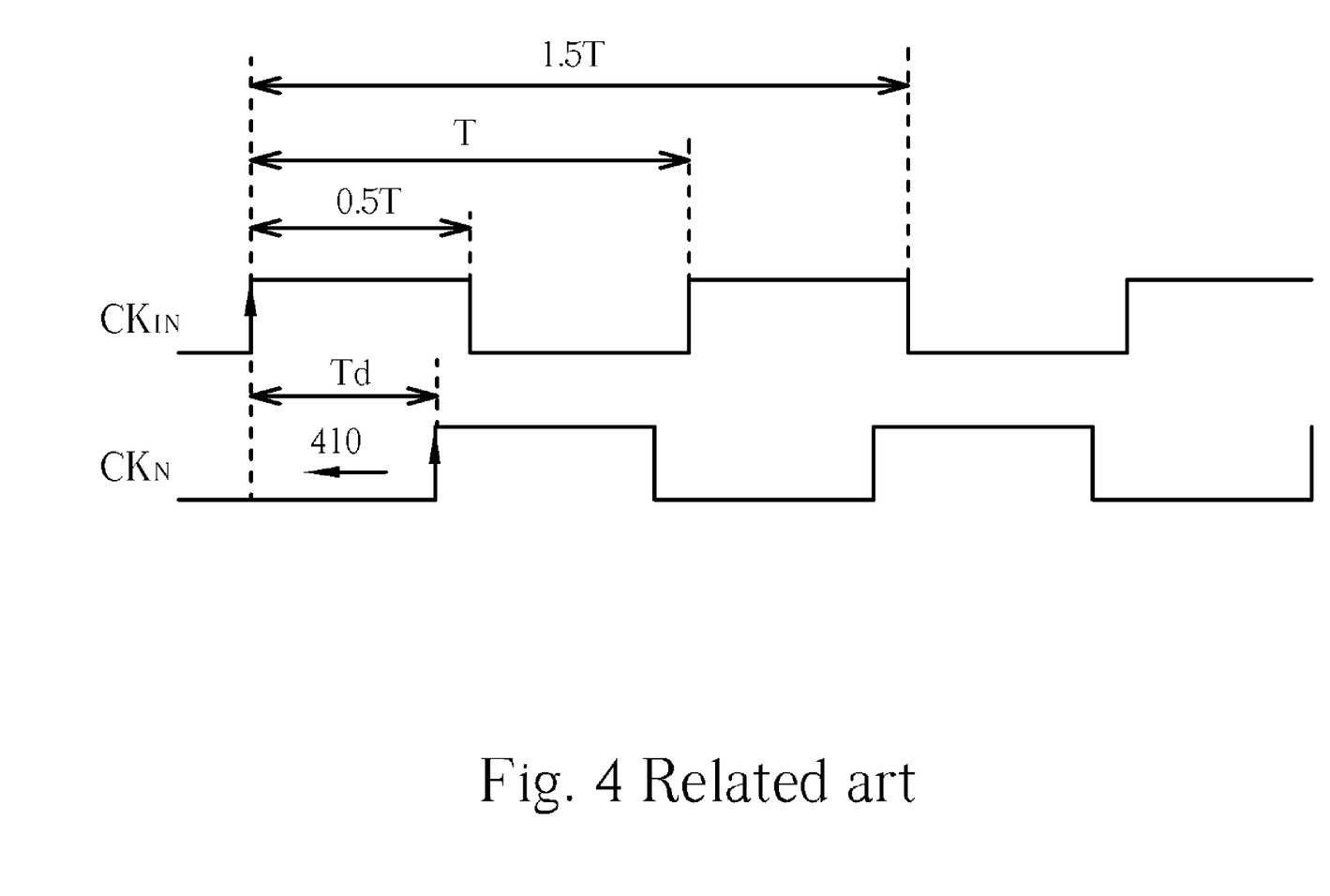
FIG. 4 and FIG. 5 are signal diagrams of the traditional DLL of FIG. 1 under false locking conditions.
Figure 5:
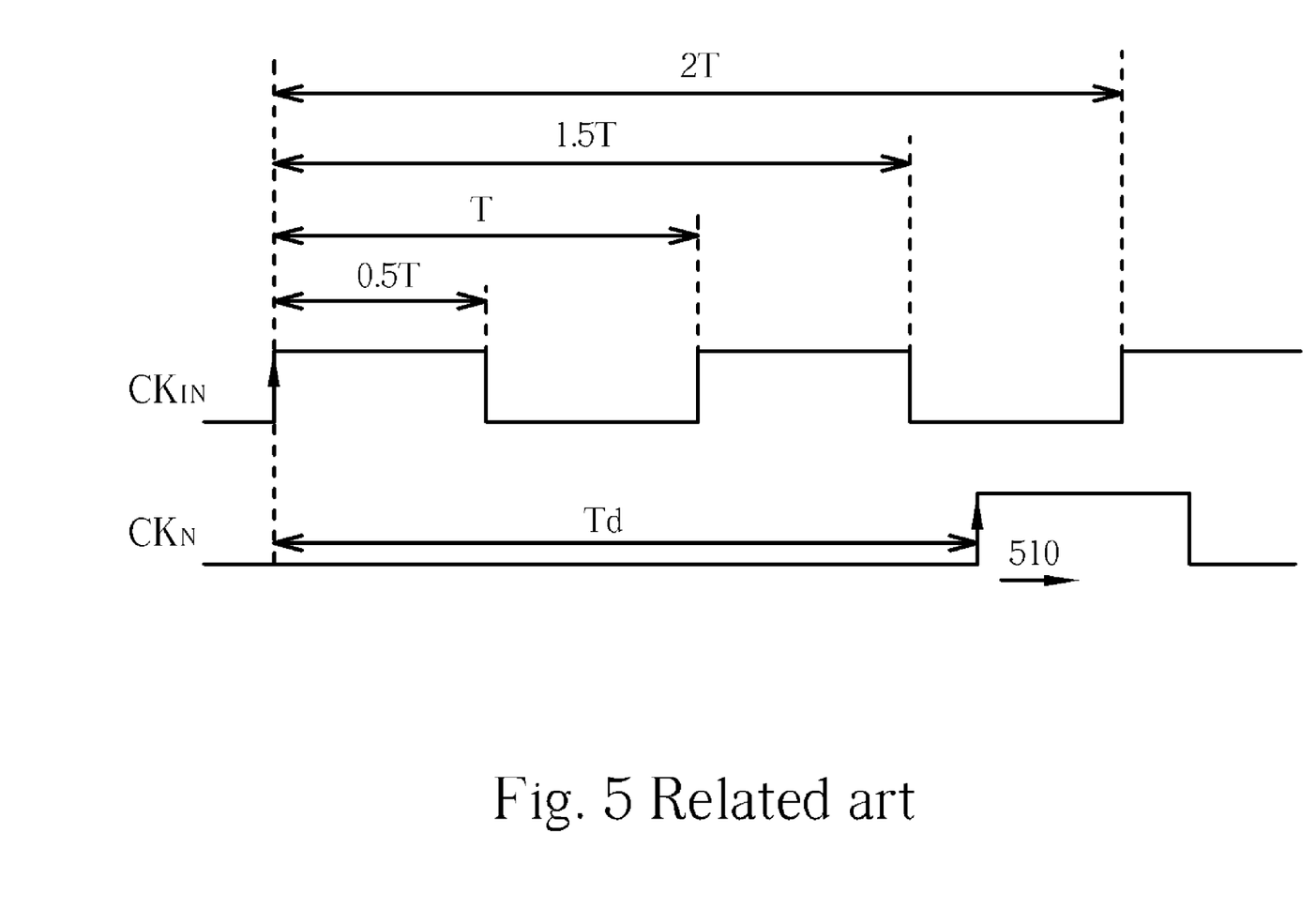

However, using the traditional DLL, delay clock $CK_N$ must lag the incoming clock signal $CK_{IN}$ by a delay lag Td being between 0.5 T and 1.5 T before the DLL will enter normal operations as shown in FIG. 2 and FIG. 3. If the delay lag Td is less than 0.5 T or greater than 1.5 T, the traditional DLL will enter a false locked condition. Please refer to FIG. 4 and FIG. 5 showing signal diagrams of a traditional DLL under false locking conditions. In FIG. 4, delay clock $CK_N$ lags the incoming clock signal $CK_{IN}$ by a delay lag Td being less than 0.5 T. During locking operations of the DLL, the rising edge of delay clock $CK_N$ is adjusted toward the nearest rising edge of the incoming clock signal $CK_{IN}$ as shown by arrow 410 (thereby decreasing the delay lag Td). But, in actuality, delay clock $CK_N$ should lag the incoming clock signal $CK_{IN}$ on the time axis. Although the delay lag Td could be decreased, in practice it cannot be decreased to zero. Therefore, a situation is produced in which when Td is decreased to a certain degree, even if the DLL continues to attempt to decrease Td, there is no further decrease in Td. That is, it is not possible to smoothly lock delay clock $CK_N$ at Td=0 T. This situation is referred to as stuck locking. In FIG. 5, delay clock $CK_N$ lags the incoming clock signal $CK_{IN}$ by a delay lag Td being greater than 1.5 T. During locking operations of the DLL 100, the rising edge of delay clock $CK_N$ is adjusted toward the nearest rising edge of the incoming clock signal $CK_{IN}$ as shown by arrow 510 (thereby increasing the delay lag Td). This results in the delay clock $CK_N$ being erroneously locked with a delay lag Td=K·T, where K is an integer greater than 1 (e.g., in FIG. 5, Td=2 T). This situation is referred to as harmonic locking.

The above mentioned stuck locking and harmonic locking situations both prevent the DLL 100 from locking with the desired delay lag of Td=T and, therefore, result in a false locked condition. A problem with the traditional DLL is that it is unable to eliminate false locked conditions.

SUMMARY OF INVENTION

One objective of the claimed invention is therefore to provide a delay locked loop (DLL) capable of preventing false lock and a related method, to solve the above-mentioned problems.

According to an exemplary embodiment of the claimed invention, a delay locked loop is disclosed capable of preventing false lock. The delay locked loop comprises a false-lock detector including: a first phase detector electrically coupled to a first clock signal and a second clock signal for comparing phases of the first clock signal and the second clock signal to produce a phase difference signal; an average circuit electrically coupled to the first phase detector for generating an average signal corresponding to an average of the phase difference signal; and a comparator circuit electrically coupled to the average circuit for comparing the average signal with at least one reference signal to produce an upward adjustment signal or a downward adjustment signal; a delay line electrically coupled to an incoming clock signal and a control node for using at least one delay lag of the delay line to delay the incoming clock signal and produce at least one delay clock according to a control signal on the control node, and a charge pump electrically coupled to the false-lock detector and the control node for adjusting the control voltage on the control node according to the upward adjustment signal or the downward adjustment signal.

According to another exemplary embodiment of the claimed invention, a method is disclosed for preventing a false locked condition in a delay lock loop. The delay locked loop uses at least one delay lag to delay an incoming clock signal and produce at least one delay clock. The method comprises the following steps: comparing phases of a first clock signal and a second clock signal to produce a phase difference signal; averaging the phase difference signal to produce an average signal; comparing the average signal with at least one reference signal to produce at least an upward adjustment signal or a downward adjustment signal; and using the upward adjustment signal or the downward adjustment signal to control the delay locked loop by adjusting the delay lags of the delay locked loop.

These and other objectives of the claimed invention will no doubt become obvious to those of ordinary skill in the art after reading the following detailed description of the preferred embodiment that is illustrated in the various figures and drawings.

DETAILED DESCRIPTION

As mentioned above, when a delay locked loop (DLL) is in a false locked condition, the last ($N^{th}$) delay stage of the delay line (in total having N delay stages) outputs a delay clock $CK_N$ having a delay lag Td being less than 0.5 T or greater than 1.5 T (where T is the period of the incoming clock signal). Assuming the delay clocks generated by the N delay stages connected in series are $CK_1$, $CK_2$, $CK_3$, ... , $CK_N$, delay clock $CK_1$ will lag the incoming clock signal $CK_{IN}$ by a delay lag of $Td_1$ (where $Td_1$=Td/N). When the DLL is in a false locked condition, delay clock $CK_1$ lags the incoming clock signal $CK_{IN}$ by a delay lag of $Td_1$ being less than 0.5 T/N or greater than 1.5 T/N. The present invention uses this property to check whether or not the DLL is falsely locked, and thereby controls the DLL to return to correct operations.

Figure 6:
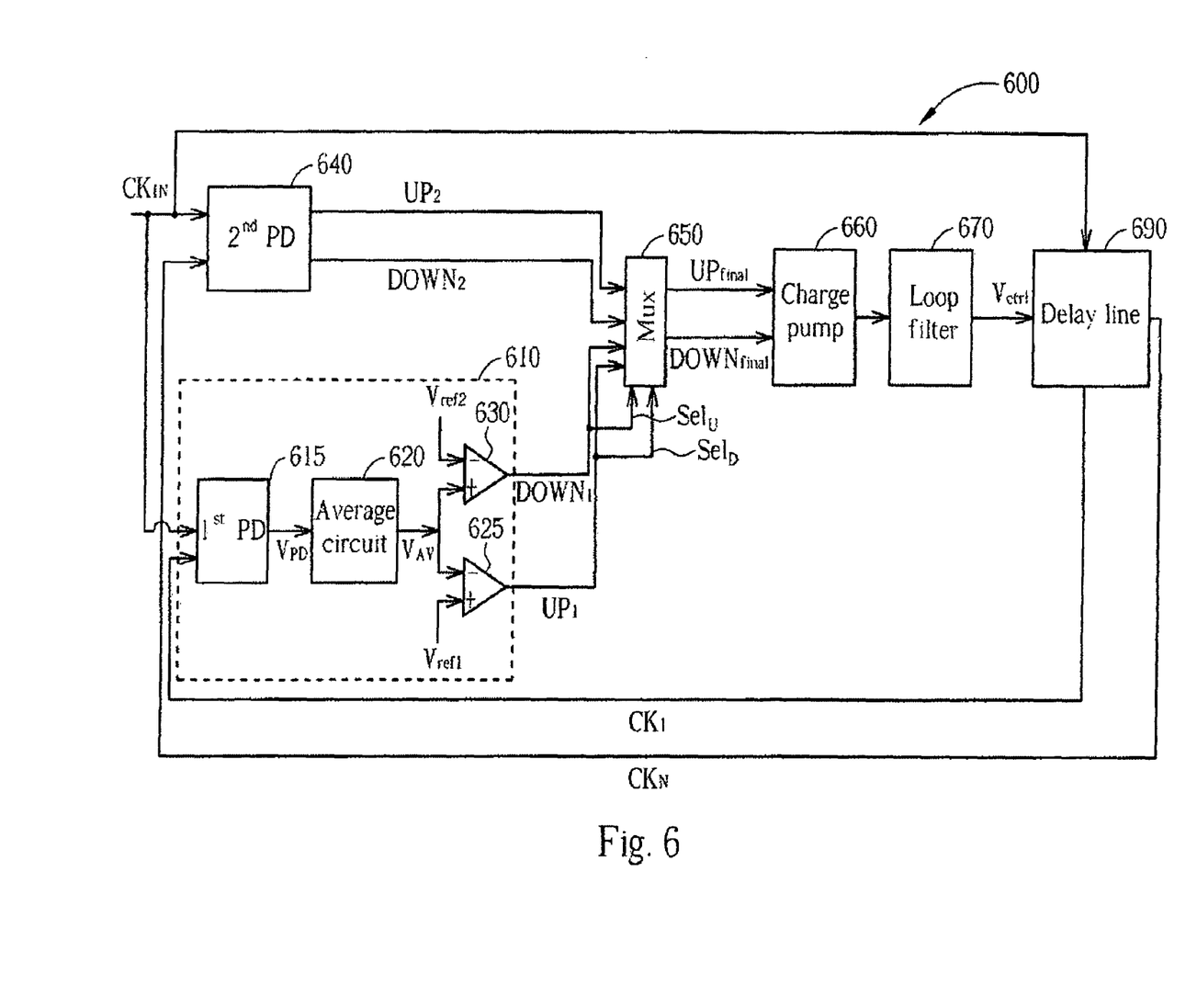
FIG. 6 is a block diagram of a DLL capable of preventing false lock according to an exemplary embodiment of the present invention.

Please refer to FIG. 6. FIG. 6 shows a block diagram of a DLL 600 capable of preventing false lock according to an exemplary embodiment of the present invention. In this embodiment, the DLL includes a false-lock detector 610, a second phase detector 640, a multiplexer 650, a charge pump 660, a loop filter 670, and a delay line 690. The functions of the second phase detector 640, the charge pump 660, the loop filter 670, and the delay line 690 are similar to the functions of the phase detector 150, the charge pump 160, the loop filter 170, and the delay line 190 of the conventional DLL 100 shown in FIG. 1. A repeated description of the operation of these elements is therefore omitted. The false-lock detector 610 further includes a first phase detector 615, an average circuit 620, and a comparator circuit (formed by a first comparator 625 and a second comparator 630). As mentioned above, the DLL 600 can be determined to be in a false locked condition by detecting the degree that delay clock $CK_1$ lags the incoming clock signal $CK_{IN}$, and more specifically, by detecting whether or not delay lag $Td_1$ is less than 0.5 T/N or greater than 1.5 T/N.

Therefore, an embodiment of the present invention involves performing circuit operations analogous with the above description. Firstly, using the first phase detector 615 to compare the phase of the incoming clock signal $CK_{IN}$ and delay clock $CK_1$ to produce a phase difference signal $V_{PD}$. Next, the average circuit 620 obtains the average value $V_{AV}$ of the phase difference signal $V_{PD}$. Continuing, the first comparator 625 and the second comparator 630 determine if the average value $V_{AV}$ is less than a first reference voltage $V_{ref1}$ or is greater than a second reference voltage $V_{ref2}$. If the average value $V_{AV}$ is less than the first reference voltage $V_{ref1}$ of if the average value $V_{AV}$ is greater than the second reference voltage $V_{ref2}$, the false-lock detector 610 respectively uses the first upward adjustment signal $UP_1$ and the first downward adjustment signal $DOWN_1$, via the multiplexer 650, to control the charge pump 660 to adjust the value of the control voltage $V_{ctrl}$. As stated above, in this embodiment, the DLL 600 is determined to be in a false locked condition if the delay lag $Td_1$ is less than 0.5 T/N or is greater than 1.5 T/N.

Figure 7:
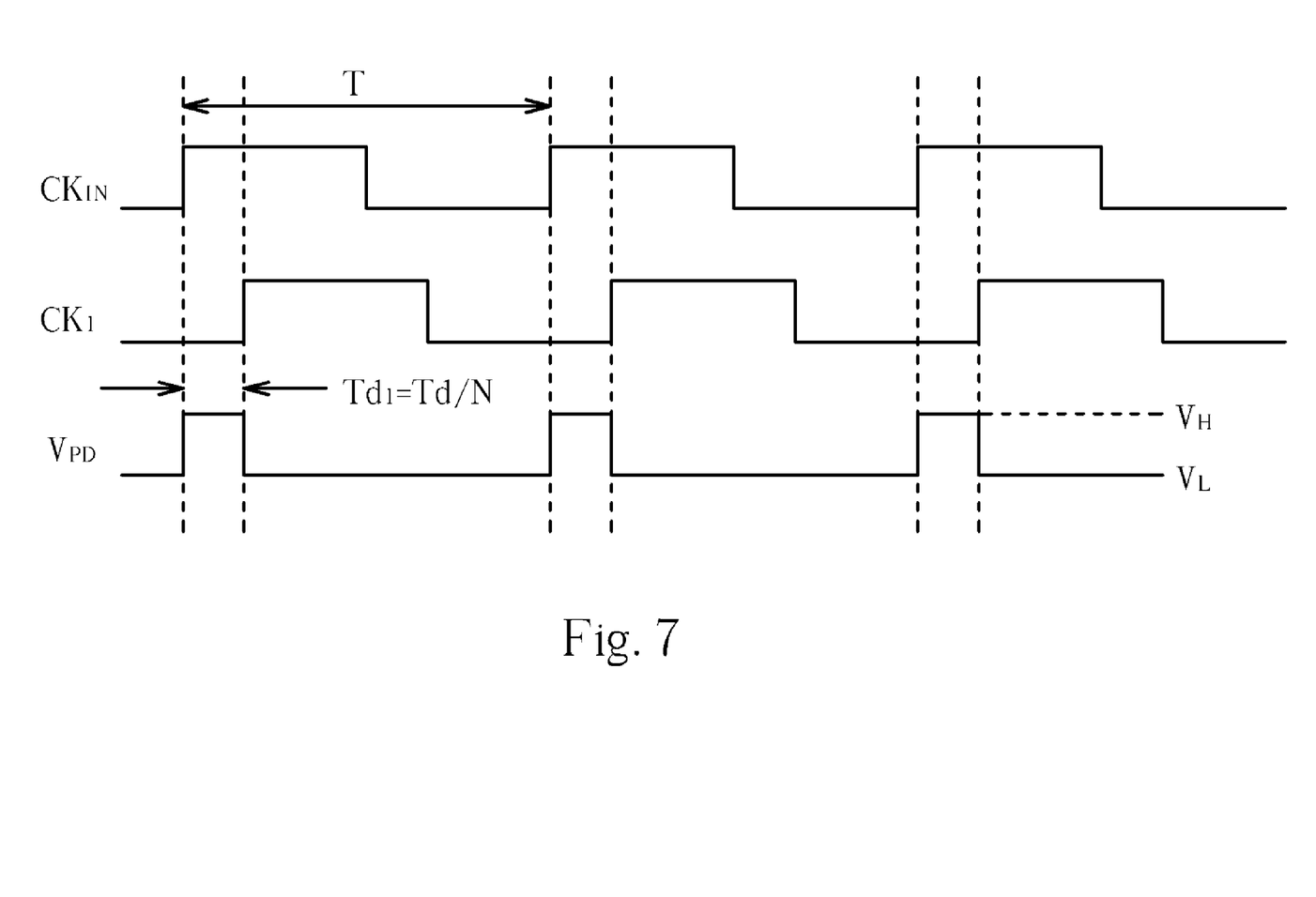
FIG. 7 is a signal diagram of the phase difference signal $V_{PD}$, the incoming clock signal $CK_{IN}$, and delay clock $CK_1$ of FIG. 6.
Figure 9:
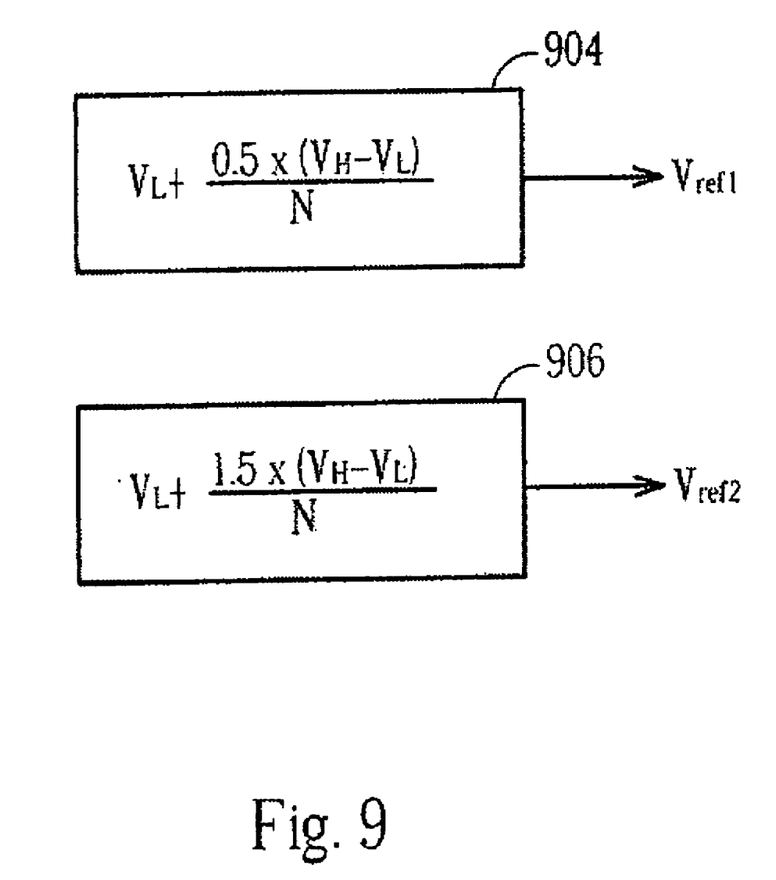
FIG. 9 shows generation of the first reference voltage $V_{ref1}$ and the second reference voltage $V_{ref2}$ of FIG. 6 according to an exmplary embodiment of the present invention.

In order to further explain the operation of this embodiment, please refer to FIG. 7. FIG. 7 shows a signal diagram of the phase difference signal $V_{PD}$, the incoming clock signal $CK_{IN}$, and delay clock $CK_1$. The phase difference signal $V_{PD}$ has two signal levels: a high level $V_H$ (typically equal to VDD) and a low level $V_L$ (typically equal to 0V). As shown, the phase difference signal $V_{PD}$ is at the high level in response to a phase difference between the incoming clock signal $CK_{IN}$ and delay clock $CK_1$. Because delay clock $CK_1$ lags the incoming clock signal $CK_{IN}$ by a delay lag of $Td_1$, the length of time that the phase difference signal $V_{PD}$ is at the high level is equal to delay lag $Td_1$. The average circuit 620 determines the average value of the phase difference signal $V_{PD}$ and outputs an average signal $V_{AV}=V_L+Td_1 \cdot (V_H-V_L)/T$. From this formula, it can be seen that when delay lag $TD_1$ is less than 0.5 T/N, the average signal $V_{AV}$ outputted by the average circuit 620 will be less than $V_L+(0.5\ T/N) \cdot (V_H-V_L)/T$, which is equivalent to $V_L+0.5 \cdot (V_H-V_L)/N$. Therefore, in this embodiment, the first reference voltage $V_{ref1}$ is equal to the value Of $V_L+0.5 \cdot (V_H-V_L)/N$ as is generated by the first reference signal generator 904 shown in FIG. 9. (Note: If $V_H$=VDD and $V_L$=0V, then $V_{ref1}$=0.5·VDD/N.) When the value of the average value $V_{AV}$ is less than the first reference voltage $V_{ref1}$, this indicates that the delay lag $Td_1$ is less than 0.5 T/N; that is, the DLL 600 is in a stuck lock condition. In this situation, the first comparator 625 outputs the first adjustment voltage signal $UP_1$ at the high level to control the delay line 690 to increase delay lag Td, which thereby also increases delay lag $Td_1$. Conversely, when the value of the average value $V_{AV}$ is greater than the first reference voltage $V_{ref1}$, the first comparator 625 outputs the first adjustment voltage signal $UP_1$ at the low level, which means that the first adjustment voltage signal $UP_1$ plays no role.

Similarly, when the delay lag $TD_1$ is greater than 1.5 T/N, the average signal $V_{AV}$ outputted by the average circuit 620 will be greater than $V_L+(1.5\ T/N) \cdot (V_H-V_L)/T$, which is equivalent to $V_L+1.5 \cdot (V_H-V_L)/N$. Therefore, in this embodiment, the second reference voltage $V_{ref2}$ is equal to the value of $V_L+1.5 \cdot (V_H-V_L)/N$ as is generated by the second reference signal generator 906 shown in FIG. 9. (Note: If $V_H$=VDD and $V_L$=0V, then $V_{ref2}$=1.5·VDD/N.) When the value of the average value $V_{AV}$ is greater than the second reference voltage $V_{ref2}$, this indicates that the delay lag $Td_1$ is greater than 1.5 T/N; that is, the DLL 600 is in a harmonic lock condition. In this situation, the second comparator 630 outputs the first downward adjustment voltage signal $DOWN_1$ at the high level to control the delay line 690 to decrease delay lag Td, which thereby also decreases delay lag $Td_1$. Conversely, when the value of the average value $V_{AV}$ is less than the second reference voltage $V_{ref2}$, the second comparator 630 outputs the first downward adjustment signal $DOWN_1$ at the low level, which means that the first downward adjustment signal $DOWN_1$ plays no role.

In this embodiment, the multiplexer 650 receives the first upward adjustment signal $UP_1$ and the first downward adjustment signal $DOWN_1$ outputted by the false-lock detector 610, and the second upward adjustment signal $UP_2$ and the second downward adjustment signal $DOWN_2$ outputted by the second phase detector 640. The multiplexer 650 outputs a final upward adjustment signal $UP_{final}$ and a final downward adjustment signal $DOWN_{final}$. The first upward adjustment signal $UP_1$ serves as a selection signal $Sel_U$. When the selection signal $Sel_U$ is at the high level, the multiplexer 650 outputs the first upward adjustment signal $UP_1$ as the final upward adjustment signal $UP_{final}$; otherwise, the multiplexer 650 outputs the second upward adjustment signal $UP_2$ as the final upward adjustment signal $UP_{final}$. The first downward adjustment signal $DOWN_1$ serves as another selection signal $Sel_D$. When the selection signal $Sel_D$ is at the high level, the multiplexer 650 outputs the first downward adjustment signal $DOWN_1$ as the final downward adjustment signal $DOWN_{final}$; otherwise, the multiplexer 650 outputs the second downward adjustment signal $DOWN_2$ as the final downward adjustment signal downward final. This is to say, when there is no false lock detected, the multiplexer 650 uses the second upward adjustment signal $UP_2$ and the second downward adjustment signal $DOWN_2$ outputted by the second PD 640 as the final upward adjustment signal $UP_{final}$ and the final downward adjustment signal $DOWN_{final}$, respectively. However, when a false locked condition is detected, the second upward adjustment signal $UP_2$ and the second downward adjustment signal $DOWN_2$ outputted by the second PD 640 may lead the control voltage $V_{ctrl}$ toward an error condition. Because of this, when the first comparator 625 detects a stuck lock condition, the multiplexer 650 in this embodiment switches to use the first upward adjustment signal $UP_1$ as the final upward adjustment signal $UP_{final}$, which thereby controls the charge pump 660 via the loop filter 670 and adjusts the value of the control voltage $V_{ctrl}$ to increase the delay lag Td. Conversely, when the second comparator 630 detects a harmonic lock condition, the multiplexer 650 in this embodiment switches to use the first downward adjustment signal $DOWN_1$ as the final downward adjustment signal $DOWN_{final}$, which thereby controls the charge pump 660 via the loop filter 670 and adjusts the value of the control voltage $V_{ctrl}$ to decrease the delay lag Td.

Please note, as mentioned above, the first phase detector 615 receives input signals being the incoming clock signal $CK_{IN}$ and delay clock $CK_1$ outputted by the first delay stage in the delay line 690. In actual implementation, the first phase detector 615 could use the incoming clock signal $CK_{IN}$ and a delay clock $CK_m$ outputted by the $m^{th}$ delay stage in the delay line 790 as input signals. When using $CK_m$ as an input signal, the value of the first reference voltage $V_{ref1}$ is equal to $V_L+0.5\cdot(V_H-V_L)\cdot m/N$, and the value of the second reference voltage $V_{ref2}$ is equal to $V_L+1.5\cdot(V_H-V_L)\cdot m/N$. (If $V_H$=VDD and $V_L$=0V, then $V_{ref1}$=0.5·VDD·m/N, and $V_{ref2}$=1.5·VDD·m/N.) Different m values will influence the range of the system for detecting false lock. As m decreases in value, the range of the system for detecting false lock widens. Therefore, in a preferred embodiment of the present invention, the delay clock $CK_1$ outputted by the first delay stage in the delay line 690 is used as an input to the first phase detector 615.

Additionally, the first phase detector 615 can use two different delay clocks being m delay stages apart in the delay chain 690 (e.g., $CK_2$ and $CK_{2+m}$). In this embodiment, the first reference voltage $V_{ref1}$ is equal to $V_L+0.5\cdot(V_H-V_L)\cdot m/N$, and the value of the second reference voltage $V_{ref2}$ is equal to $V_L+1.5\cdot(V_H-V_L)\cdot m/N$. (If $V_H$=VDD and $V_L$=0V, then $V_{ref1}$=0.5·VDD·m/N, and $V_{ref2}$=1.5·VDD·m/N.) Similar to the previous embodiment, as m decreases in value, the range of the system for detecting false lock widens.

In the embodiment shown in FIG. 6, the false-lock detector 610 simultaneously detects whether or not the DLL 600 is in a stuck lock condition (using the first comparator 625) or a harmonic lock condition (using the second comparator 630). However, when implementing the present invention, the false-lock detector 610 could also only include the first comparator 625 (therefore not include the second comparator 630 and only be capable of detecting the stuck lock condition), or only include the second comparator 630 (therefore not include the first comparator 625 and only be capable of detecting the harmonic lock condition). Determining whether to use the first comparator 625 and/or the second comparator 630 is a design decision based on application requirements, all the combinations form different embodiments of the present invention.

Figure 8:
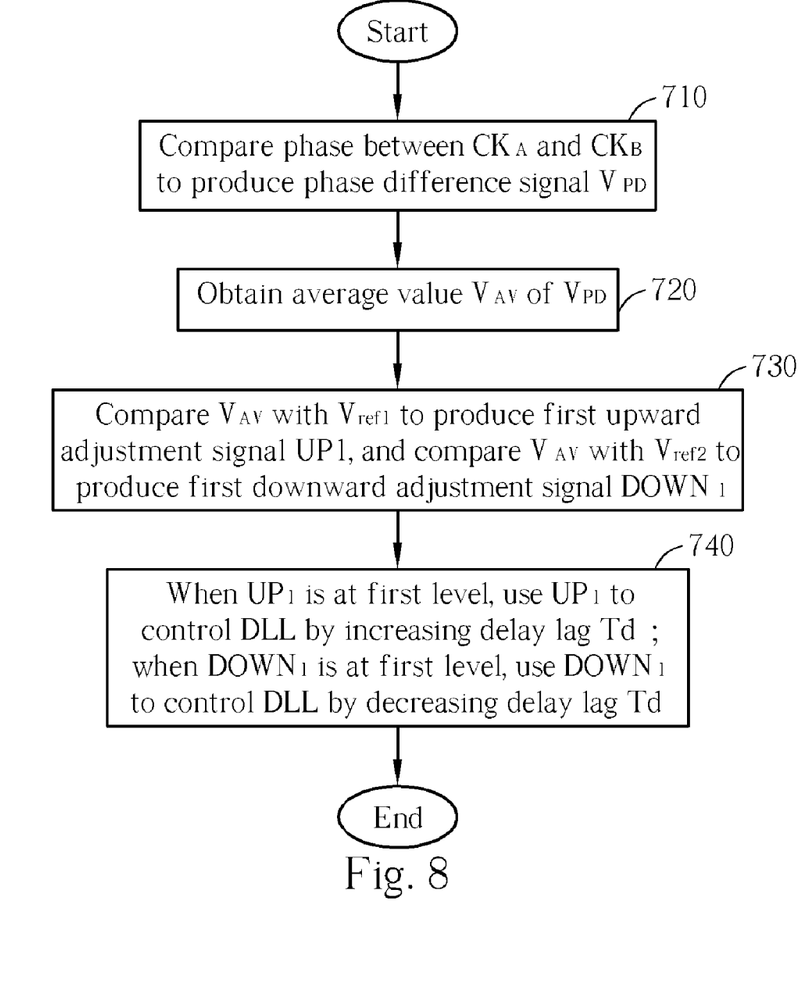
FIG. 8 shows a flowchart describing operations of preventing a false locked condition in a delay lock loop according to an exemplary embodiment of the present invention.

Continuing, please refer to FIG. 8. FIG. 8 shows a flowchart describing operations according to an exemplary embodiment of the present invention. The operations described in the flowchart are used within a delay locked loop (DLL) to prevent the DLL from falsely locking. The DLL includes a delay line and receives an input signal being an incoming clock signal $CK_{IN}$ (having a period of T). The delay line includes N delay stages connected in series and thereby produces delay clocks: $CK_1$, $CK_2$, $CK_3$, ..., $CK_N$. Wherein, delay clock $CK_N$ lags the incoming clock signal $CK_{IN}$ by a delay lag Td. The flowchart contains the following steps:

Step 710: Compare the phase between a first clock signal $CK_A$ and a second clock signal $CK_B$ to produce a phase difference signal $V_{PD}$.

Step 720: Obtain an average value $V_{AV}$ of the phase difference signal $V_{PD}$.

Step 730: Compare the average value $V_{AV}$ with a first reference $V_{ref1}$ and produce a corresponding first upward adjustment signal $UP_1$, and compare the average value $V_{AV}$ with a second reference $V_{ref2}$ and produce a corresponding first downward adjustment signal $DOWN_1$.

Step 740: When the first upward adjustment signal $UP_1$ is at a first level, use the first upward adjustment signal $UP_1$ to control the DLL to increase the delay lag Td; when the first downward adjustment signal $DOWN_1$ is at a first level, use the first downward adjustment signal $DOWN_1$ to control the DLL to decrease the delay lag Td.

As described for FIG. 6, assume the phase difference signal $V_{PD}$ has two levels: a high level $V_H$ and a low level $V_L$. If the first clock signal $CK_A$ and the second clock signal $CK_B$ used in step 710 are the incoming clock signal $CK_{IN}$ and the delay clock $CK_1$ outputted by the first delay stage in the delay line, a voltage value of the first reference $V_{ref1}$ is equal to $V_L+0.5\cdot(V_H-V_L)/N$ and a voltage value of the second reference $V_{ref2}$ is equal to $V_L+1.5\cdot(V_H-V_L)/N$. (If $V_H$=VDD and $V_L$=0V, then $V_{ref1}$=0.5·VDD/N, and $V_{ref2}=1.5\cdot VDD/N$.) In another embodiment, the first clock signal $CK_A$ and the second clock signal $CK_B$ used in step 710 could also be the incoming clock signal $CK_{IN}$ and a delay clock $CK_m$ outputted by the $m^{th}$ delay stage in the delay line, respectively. In this embodiment, a voltage value of the first reference voltage $V_{ref1}$ is equal to $V_L+0.5\cdot(V_H-V_L)\cdot m/N$, and a voltage value of the second reference voltage $V_{ref2}$ is equal to $V_L+1.5\cdot(V_H-V_L)\cdot m/N$. (If $V_H=VDD$ and $V_L=0V$, then $V_{ref1}=0.5\cdot VDD\cdot m/N$, and $V_{ref2}=1.5\cdot VDD\cdot m/N$.) Additionally, in another embodiment, the first clock signal $CK_A$ and the second clock signal $CK_B$ used in step 710 could also be two different delay clocks being m delay stages apart in the delay chain (e.g., $CK_2$ and $CK_{2+m}$). In this embodiment, a voltage value of the first reference $V_{ref1}$ is equal to $V_L+0.5\cdot(V_H-V_L)\cdot m/N$, and a voltage value of the second reference $V_{ref2}$ is equal to $V_L+1.5\cdot(V_H-V_L)\cdot m/N$. (If $V_H=VDD$ and $V_L=0V$, then $V_{ref1}=0.5\cdot VDD\cdot m/N$, and $V_{ref2}=1.5\cdot VDD\cdot m/N$.)

Those skilled in the art will readily observe that numerous modifications and alterations of the device may be made while retaining the teachings of the invention. Accordingly, the above disclosure should be construed as limited only by the metes and bounds of the appended claims.

What is claimed is:

1. A delay locked loop capable of preventing false lock, the delay locked loop comprising:
    a false-lock detector including:
        a first phase detector electrically coupled to a first clock signal and a second clock signal for comparing phases of the first clock signal and the second clock signal to produce a phase difference signal;
        an average circuit electrically coupled to the first phase detector for generating an average signal corresponding to an average of the phase difference signal; and
        a comparator circuit electrically coupled to the average circuit for comparing the average signal with at least one reference signal to produce an upward adjustment signal or a downward adjustment signal;
    a delay line electrically coupled to an incoming clock signal and a control node for using at least one delay lag of the delay line to delay the incoming clock signal and produce at least one delay clock according to a control signal on the control node, and
    a charge pump electrically coupled to the false-lock detector and the control node for adjusting the control voltage on the control node according to the upward adjustment signal or the downward adjustment signal;
    at least one reference signal generator for generating the at least one reference signal according to a low level and a high level of the phase difference signal.

2. The delay locked loop of claim 1, wherein the comparator circuit comprises:
    a first comparator for comparing the average signal with a first reference signal to produce the first upward adjustment signal;
    wherein, if the average signal is less than the first reference signal, the first upward adjustment signal is produced at a first level to control the delay loop to increase the delay lags of the delay line.

3. The delay locked loop of claim 2, wherein the first reference signal is equal to $V_L+0.5*(V_H-V_L)/N$, where $V_L$ is the low level of the phase difference signal, $V_H$ is the high level of the phase difference signal, and N corresponds to the number of delay stages included in the delay line.

4. The delay locked loop of claim 1, wherein the comparator circuit comprises:
    a second comparator for comparing the average signal with a second reference signal to produce the first downward adjustment signal;
    wherein, if the average signal is greater than the second reference signal, the first downward adjustment signal is produced at a first level to control the delay loop to decrease the delay lags of the delay line.

5. The delay locked loop of claim 4, wherein:
    the second reference signal is equal to $V_L+1.5*(V_H-V_L)/N$, where $V_L$ is the low level of the phase difference signal, $V_H$ is the high level of the phase difference signal, and N corresponds to the number of delay stages included in the delay line.

6. The delay locked loop of claim 1, further comprising:
    a second phase detector for comparing phases of the incoming clock signal and a third clock signal to produce a second upward adjustment signal and a second downward adjustment signal; and
    a multiplexer electrically coupled to the comparator circuit, the second phase detector, and the charge pump for controlling the charge pump to adjust the control signal on the control node according to the first upward adjustment signal outputted by the comparator circuit, and according to the second upward adjustment signal and the second downward adjustment signal outputted by the second phase detector;
    wherein, the third clock signal is a delay clock of the delay line having a largest lag with respect to the incoming clock signal.

7. The delay locked loop of claim 6, wherein if the first upward adjustment signal is at a first level, the multiplexer outputs the first upward adjustment signal to the charge pump to increase the delay lags of the delay line.

8. The delay locked loop of claim 1, further comprising:
    a second phase detector for comparing phases of the incoming clock signal and a third clock signal to produce a second upward adjustment signal and a second downward adjustment signal; and
    a multiplexer electrically coupled to the comparator circuit, the second phase detector, and the charge pump for controlling the charge pump to adjust the control signal on the control node according to the first downward adjustment signal outputted by the comparator circuit, and according to the second upward adjustment signal and the second downward adjustment signal outputted by the second phase detector;
    wherein, the third clock signal is a delay clock of the delay line having a largest lag with respect to the incoming clock signal.

9. The delay locked loop of claim 8, wherein if the firs downward adjustment signal is at a first level, the multiplexer outputs the first downward adjustment signal to the charge pump to decrease the delay lags of the delay line.

10. The delay locked loop of claim 1, further comprising:
    a second phase detector for comparing phases of the incoming clock signal with a third clock signal to produce a second upward adjustment signal and a second downward adjustment signal; and
    a multiplexer electrically coupled to the comparator circuit, the second phase detector, and the charge pump for controlling the charge pump to adjust the control signal on the control node according to the first upward adjustment signal and the first downward adjustment signal outputted by the comparator circuit, and according to the second upward adjustment signal and the second downward adjustment signal outputted by the second phase detector;

wherein, the third clock signal is a delay clock of the delay line having a largest lag with respect to the incoming clock signal.

11. The delay locked loop of claim 10, wherein if the first upward adjustment signal is at a first level, the multiplexer outputs the first upward adjustment signal to the charge pump to increase the delay lags of the delay line; and if the first downward adjustment signal is at a first level, the multiplexer outputs the first downward adjustment signal to the charge pump to decrease the delay lags of the delay line.

12. The delay locked loop of claim 1, wherein the first clock signal is the incoming clock signal and the second clock signal is a selected delay clock of the delay line.

13. The delay locked loop of claim 12, wherein the selected delay clock is a delay clock having a smallest delay lag with respect to the incoming clock signal.

14. The delay locked loop of claim 1, wherein the first clock signal is a first selected delay clock of the delay line and the second clock signal is a second selected delay clock of the delay line.

15. The delay locked loop of claim 14, wherein the first and second selected delay clocks are two delay clocks of the delay line having a smallest delay lag difference.

16. A method of preventing a false locked condition in a delay lock loop, the delay locked loop for using at least one delay lag to delay an incoming clock signal and produce at least one delay clock, the method comprising the following steps:
   comparing phases of a first clock signal and a second clock signal to produce a phase difference signal;
   averaging the phase difference signal to produce an average signal;
   generating at least one reference signal according to a low level and a high level of the phase difference signal;
   comparing the average signal with the at least one reference signal to produce at least an upward adjustment signal or a downward adjustment signal; and
   using the upward adjustment signal or the downward adjustment signal to control the delay locked loop by adjusting the delay lags of the delay locked loop.

17. The method of claim 16, further comprising if the average signal is less than a first reference signal, producing a first upward adjustment signal at a first level to increase the delay lags of the delay locked loop.

18. The method of claim 17, wherein the first reference signal is equal to $V_L+0.5*(V_H-V_L)/N$, where $V_L$ is the low level of the phase difference signal, $V_H$ is the high level of the phase difference signal, and N corresponds to the number of delay clocks produced in the delay locked loop.

19. The method of claim 16, further comprising if the average signal is greater than a second reference signal, producing a first downward adjustment signal at a first level to decrease the delay lags of the delay locked loop.

20. The method of claim 19, wherein the second reference signal is equal to $V_L+1.5*(V_H-V_L)/N$, where $V_L$ is the low level of the phase difference signal, $V_D$ is the high level of the phase difference signal, and N corresponds to the number of delay clocks produced in the delay locked loop.

21. The method of claim 16, wherein the first clock signal is the incoming clock signal and the second clock signal is a selected delay clock of the delay line.

22. The method of claim 21, wherein the selected delay clock is a delay clock having a smallest delay lag with respect to the incoming clock signal.

23. The method of claim 16, wherein the first clock signal is a first selected delay clock of the delay line and the second clock signal is a second selected delay clock of the delay line.

24. The method of claim 23, wherein the first and second selected delay clocks are two delay clocks of the delay line having a smallest delay lag difference.

* * * * *